(12) United States Patent
Yamaguchi et al.

(10) Patent No.: US 10,388,906 B2
(45) Date of Patent: Aug. 20, 2019

(54) ORGANIC EL ELEMENT, ORGANIC EL DISPLAY PANEL, AND ORGANIC EL DISPLAY PANEL MANUFACTURING METHOD

(71) Applicant: JOLED INC., Tokyo (JP)

(72) Inventors: Jun Yamaguchi, Tokyo (JP); Kenji Harada, Tokyo (JP); Masahiro Tanaka, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/928,565

(22) Filed: Mar. 22, 2018

(65) Prior Publication Data

US 2018/0294432 A1 Oct. 11, 2018

(30) Foreign Application Priority Data

Apr. 6, 2017 (JP) .................. 2017-076076

(51) Int. Cl.
| | | |
|---|---|---|
| *H01L 51/52* | (2006.01) | |
| *H01L 51/56* | (2006.01) | |
| *H01L 27/32* | (2006.01) | |
| *H01L 51/00* | (2006.01) | |

(52) U.S. Cl.
CPC ...... *H01L 51/5234* (2013.01); *H01L 51/5215* (2013.01); *H01L 51/5265* (2013.01); *H01L 51/56* (2013.01); *H01L 27/3211* (2013.01); *H01L 27/3244* (2013.01); *H01L 51/0021* (2013.01); *H01L 51/5218* (2013.01); *H01L 2227/323* (2013.01); *H01L 2251/301* (2013.01); *H01L 2251/308* (2013.01); *H01L 2251/5315* (2013.01); *H01L 2251/558* (2013.01)

(58) Field of Classification Search
CPC .................................................. H01L 51/5203
USPC .............................................. 257/40; 438/99
See application file for complete search history.

(56) References Cited

U.S. PATENT DOCUMENTS

| | | | | |
|---|---|---|---|---|
| 5,952,778 A * | 9/1999 | Haskal | ................ | H01L 51/5256 313/504 |
| 9,093,664 B2 * | 7/2015 | Kashiwabara | ...... | H01L 51/5265 |
| 2004/0239239 A1 * | 12/2004 | Fukase | ................ | H01L 51/5092 313/506 |
| 2004/0245918 A1 * | 12/2004 | Lee | ..................... | H01L 51/5234 313/503 |
| 2006/0232203 A1 * | 10/2006 | Noda | .................. | H01L 51/5203 313/506 |
| 2007/0182320 A1 * | 8/2007 | Nakamura | .............. | H01L 51/50 313/506 |
| 2010/0090592 A1 | 4/2010 | Shiobara et al. | | |

(Continued)

FOREIGN PATENT DOCUMENTS

| | | |
|---|---|---|
| JP | 2014-140048 A | 7/2014 |
| JP | 2015-60728 A | 3/2015 |

*Primary Examiner* — George R Fourson, III
(74) *Attorney, Agent, or Firm* — Hauptman Ham, LLP

(57) ABSTRACT

An organic electro-luminescence (EL) element includes a first electrode, a light emitting layer, and a second electrode layered in this order above a substrate. At least one of the first electrode and the second electrode is a light transmissive electrode. The light transmissive electrode includes a base metal layer and a silver thin film. The base metal layer is a metal layer including an alkali metal or an alkaline earth metal as a material. The silver thin film is silver or a silver alloy including silver as a main component, and is disposed on and in contact with the base metal layer.

12 Claims, 8 Drawing Sheets

(56) References Cited

U.S. PATENT DOCUMENTS

| | | | |
|---|---|---|---|
| 2010/0148661 A1* | 6/2010 | Farquhar | H01L 51/5259 313/504 |
| 2011/0057920 A1* | 3/2011 | Matsuura | H01L 27/3258 345/211 |
| 2011/0156079 A1* | 6/2011 | Nakatani | H01L 51/0004 257/98 |
| 2011/0260955 A1* | 10/2011 | Yoshida | H01L 27/3246 345/76 |
| 2011/0309739 A1* | 12/2011 | Song | H01L 51/5088 313/504 |
| 2013/0112953 A1* | 5/2013 | Nobuki | H01L 51/5271 257/40 |
| 2014/0151681 A1* | 6/2014 | Iwasaki | H01L 51/5072 257/40 |
| 2017/0213876 A1* | 7/2017 | Ohsawa | H01L 27/3213 |
| 2017/0279068 A1* | 9/2017 | Shiratori | H01L 51/5203 |
| 2017/0346023 A1* | 11/2017 | Jankus | H01L 51/5068 |
| 2018/0151630 A1* | 5/2018 | Yamaoka | H01L 51/504 |
| 2018/0247981 A1* | 8/2018 | Yamaoka | H01L 51/5056 |

* cited by examiner

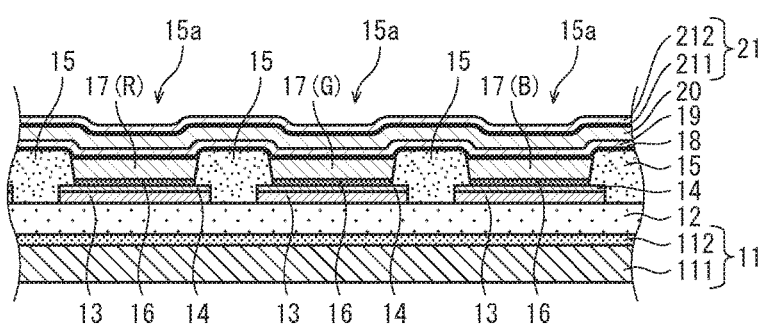
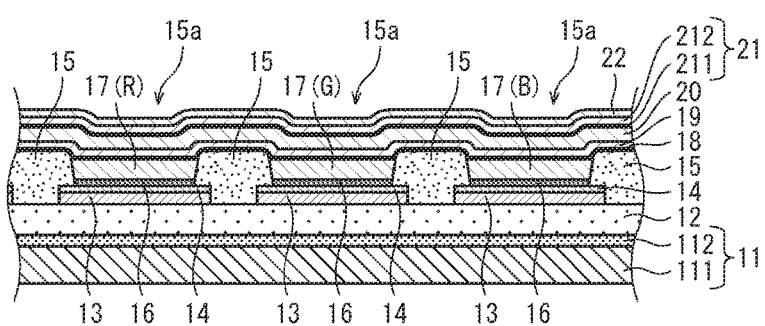

ORGANIC EL ELEMENT, ORGANIC EL DISPLAY PANEL, AND ORGANIC EL DISPLAY PANEL MANUFACTURING METHOD

This application claims priority to Japanese Patent Application No. 2017-076076, filed Apr. 6, 2017, the contents of which are hereby incorporated by reference in their entirety.

BACKGROUND OF THE DISCLOSURE

(1) Technical Field

The present disclosure is directed to organic electroluminescence (EL) elements, organic EL display panels, and organic EL display panel manufacturing methods, especially light transmissive electrodes and methods for manufacturing light transmissive electrodes.

(2) Description of Related Art

Flat-surface display panels including liquid crystal displays and organic EL display devices are being widely used. These light emitting panels generally have a structure in which a light emitting layer is disposed between an anode and a cathode. In order to extract light from the light emitting layer, either the anode or the cathode of the light emitting panel is light transmissive to transmit visible light. For example, the so-called top emission type of light emitting panels have light reflective electrodes set at the substrate side and light transmissive electrodes at the opposite side for efficient light extraction. While materials such as silver (Ag) and aluminum (Al) are used for light reflective electrodes, metal oxides such as indium tin oxide (ITO) and indium zinc oxide (IZO) are used for light transmissive electrodes (e.g. JP2014-140048).

Both low resistance and high transmittance are desired for electrodes formed by using light-transmissive materials (hereinafter referred to as "light transmissive electrodes"). Therefore, metal oxides as well as thin metallic films are used. Moreover, uniform film quality is desired for light transmissive electrodes to enhance efficiency in light transmission and stability in characteristics such as electrical resistivity. Therefore, the electrodes are formed by methods such as vapor deposition and sputtering.

SUMMARY

The present disclosure includes an organic EL element and an organic EL display panel for improving the uniformity of film quality when a light transmissive electrode is formed by a thin metal film with silver as a main component, and a method for manufacturing the organic EL element and the organic EL display panel.

An organic electro-luminescence (EL) element pertaining to at least one embodiment of the present disclosure is an organic EL element including a first electrode, a light emitting layer, and a second electrode layered in this order above a substrate. At least one of the first electrode and the second electrode is a light transmissive electrode. The light transmissive electrode includes a base metal layer and a silver thin film. The base metal layer is a metal layer including an alkali metal or an alkaline earth metal as a material. The silver thin film is silver or a silver alloy including silver as a main component, and is disposed on and in contact with the base metal layer.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

FIG. 3A is a partial cross-sectional view showing a state in which a TFT layer is formed on a substrate. FIG. 3B is a partial cross-sectional view showing a state in which an interlayer insulating layer is formed on the TFT layer. FIG. 3C is a partial cross-sectional view showing a state in which a pixel electrode material layer is formed on the interlayer insulating layer. FIG. 3D is a partial cross-sectional view showing a state in which a hole injection material layer is formed on the pixel electrode material layer. FIG. 3E is a partial cross-sectional view showing a state in which the pixel electrode material layer and the hole injection material layer are patterned to form a pixel electrode and a hole injection layer.

FIG. 4A is a partial cross-sectional view showing a state in which a bank material layer is formed on the hole injection layer and the interlayer insulating layer. FIG. 4B is a partial cross-sectional view showing a state in which a bank layer is formed by patterning the bank material layer. FIG. 4C is a partial cross-sectional view showing a state in which a hole transport layer is formed in an opening of the bank layer. FIG. 4D is a partial cross-sectional view showing a state in which a light emitting layer is formed on the hole transport layer in the opening of the bank layer.

FIG. 5A, FIG. 5 B, FIG. 5A is a partial cross-sectional view showing a state in which an electron transport layer is formed on the bank layer and the light emitting layer. FIG. 5C is a partial cross-sectional view showing a state in which a light transmissive electrically conductive layer is formed on the electron injection layer. FIG. 5D is a partial cross-sectional view showing a state in which a first counter electrode is formed on the light transmissive electrically conductive layer.

FIG. 6A and FIG. 6B are partial cross-sectional views schematically showing a part of the organic EL display panel 100 manufacturing process pertaining to at least one embodiment. FIG. 6A is a partial cross-sectional view showing a state in which a second counter electrode is formed on the first counter electrode. FIG. 6B is a partial cross-sectional view showing a state in which a sealing layer is formed on the second counter electrode.

DETAILED DESCRIPTION

Figure 1:
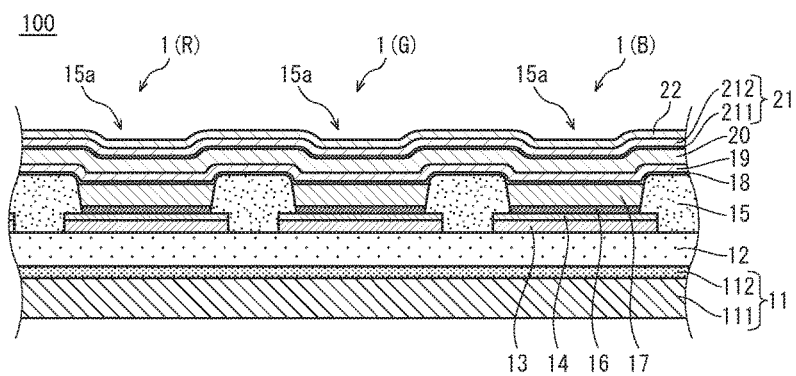
FIG. 1 is a cross-sectional view schematically showing the structure of an organic EL display panel 100 pertaining to at least one embodiment of the present disclosure.

High transmittance of visible light and low electric resistance are typically required for a light transmissive electrode of a light emitting panel. High visible light transmittance of a light transmissive electrode helps to enhance light extraction efficiency. On the other hand, the electrical resistance of the electrode parallel to the panel (hereinafter referred to as "sheet resistance") increases as size of the light emitting panel increases, causing a voltage drop which can cause variation in the voltage applied to each element. Therefore, as a means to reduce the sheet resistance of light transmissive electrodes, silver (Ag) thin films are being considered for use as electrodes, since silver has high electrical conductivity. However, in order to use a silver thin film for the electrode, thickness of the film must be about 7 nm to 17 nm. Until now, in the case of forming such silver thin film as a light transmissive electrode, the islanding phenomenon has caused problems as described below.

The islanding phenomenon refers to formation of heterogeneous silver thin film caused by generation of nano-sized crystals (hereinafter referred to as "islands") during formation of silver thin film. Silver atoms have a property of being easily deposited on a phase containing silver. In particular, when attempting to form a silver thin film with thickness of 50 nm or less, the film is formed by heterogeneous growth of many islands. Therefore, the surface of the thin film will have many bumps formed by islands and recessed parts between the islands, causing local variation in film thickness. Hence, both the transmittance and the reflectance of visible light are reduced, making the sheet resistance heterogeneous.

In addition, since the islands are large in relation to the film thickness of the silver thin film, electrical resistivity differs between the inside of the island (the inside of the crystal) and the outside of the island (crystal grain boundary). This causes electric conductivity to become non-uniform in the silver thin film. Therefore, in the island, sheet resistance is low due to lower electrical resistivity and thicker film, whereas in the recessed parts between the islands, sheet resistance is higher due to higher electrical resistivity and thinner film. Hence, the sheet resistance of the silver thin film widely differs in local areas, and when used as an electrode, voltage applied to each one of the light emitting elements will vary. Also, plasmons will localize on the surface of the island and absorb visible light (plasmon absorption), remarkably lowering the light transmittance for a specific wavelength of visible light in some cases.

The inventors arrived at the idea of forming a metal thin film directly under a silver thin film, forming a silver thin film on a metal thin film. The islanding phenomenon of the silver thin film is caused by the characteristic of silver in which its atoms tend to aggregate. The inventors found out that by using a metal thin film which is prone to adhere silver atoms as a base, silver atoms can be adsorbed on the surface of the metal thin film to alleviate the aggregation of silver atoms for the purpose of suppressing islanding. This led to the realization of the light emitting panel manufacturing method pertaining to at least one aspect of the present disclosure.

An organic electro-luminescence (EL) element pertaining to at least one embodiment of the present disclosure is an organic EL element including a first electrode, a light emitting layer, and a second electrode layered in this order above a substrate. At least one of the first electrode and the second electrode is a light transmissive electrode. The light transmissive electrode includes a base metal layer and a silver thin film. The base metal layer is a metal layer including an alkali metal or an alkaline earth metal as a material. The silver thin film is silver or a silver alloy including silver as a main component, and is disposed on and in contact with the base metal layer.

According to at least one embodiment of the present disclosure, an organic EL element includes a light reflective pixel electrode, a light emitting layer, and a light transmissive counter electrode layered in this order above a substrate. A method of manufacturing the organic EL element pertaining to at least one embodiment of the present disclosure includes forming the counter electrode. Forming the counter electrode includes forming a base metal layer to include a metal layer including an alkaline metal or an alkaline earth metal as a material, and forming a silver thin film, which is silver or includes silver as a main component, after forming the base metal layer.

Further, according to at least one embodiment of the present disclosure, an organic EL element includes a light transmissive pixel electrode, a light emitting layer, and a light reflective counter electrode layered in this order above a substrate. A method of manufacturing the organic EL element pertaining to at least one other embodiment of the present disclosure includes forming the pixel electrode. Forming the pixel electrode includes forming a base metal layer to include a metal layer including an alkaline metal or an alkaline earth metal as a material, and forming a silver thin film, which is silver or a silver alloy including silver as a main component, after forming the base metal layer.

The organic EL element pertaining to at least one embodiment and the manufacturing method pertaining to at least one embodiment increase the homogeneity of a silver thin film in a light transmissive electrode. Thereby the light extraction efficiency of the light transmissive electrode is enhanced while suppressing a decline in the voltage applied to organic EL elements in local areas of an organic EL display panel caused by electric resistance in the light transmissive electrode.

According to at least one embodiment, the thickness of the silver thin film is 20 nm or less.

This enhances the light transmittance of the light transmissive electrode realizing high light extraction efficiency.

According to at least one embodiment, the material of the base metal layer is selected from the group consisting of barium, calcium, magnesium, and combinations thereof.

This enhances further stability of the film quality of the silver thin film.

According to at least one embodiment, the material of the base metal layer is barium.

This enhances further stability of the film quality of the silver thin film.

According to at least one embodiment, the film thickness of the base metal layer is from 0.5 nm to 5 nm.

This enhances the stability of the film quality of the silver thin film and maintains sufficient light transmittance of the base metal layer.

According to at least one embodiment, the film thickness of the base metal layer is from 1 nm to 2 nm.

This enhances further stability of the film quality of the silver thin film and maintains sufficiently high light transmittance of the base metal layer.

According to at least one embodiment, the organic EL element further includes a light transmissive electrically conductive layer disposed between the light emitting layer and the second electrode, in contact with the second electrode, where the second electrode is the light transmissive electrode. A light emitting layer-side surface of the first electrode and an interface of the light transmissive electrically conductive layer and the second electrode are reflective surfaces of an optical resonator structure.

The light extraction efficiency is further enhanced by forming the optical resonator.

According to at least one embodiment, the material for the light transmissive electrically conductive layer is selected from the group consisting of indium tin oxide (ITO) and indium zinc oxide (IZO).

This ensures the light reflectance of the interface of the light transmissive electrically conductive film and the second electrode, and enhances the efficiency of the optical resonator.

An organic EL panel pertaining to at least one aspect of the present disclosure comprises an organic EL element pertaining to any one aspect of the present disclosure.

1. Schematic Configuration of Light Emitting Panel

The following describes an organic EL display panel as an example of a light emitting panel pertaining to at least one aspect of the present disclosure.

FIG. 1 is a partial cross-sectional view of an organic EL display panel 100 pertaining to at least one embodiment of the present disclosure. An organic EL display panel 100 has multiple pixels each including organic EL elements 1(R), 1(G), and 1(B), emitting red, green, and blue light, respectively. FIG. 1 is a cross-sectional view of one of the pixels.

In an organic EL display panel 100, each organic EL element 1 is a so-called top emission type from which light is output forward (toward the upper side of FIG. 1).

As organic EL element 1(R), organic EL element 1(G) and organic EL element 1(B) have almost the same configuration, the elements will be described as organic EL element 1 hereinafter unless a distinction is made.

As shown in FIG. 1, an organic EL element 1 includes a substrate 11, an interlayer insulating layer 12, a pixel electrode 13, a hole injection layer 14, a bank layer 15, a hole transport layer 16, a light emitting layer 17, an electron transport layer 18, an electron injection layer 19, a light transmissive electrically conductive layer 20, a counter electrode 21, and a sealing layer 22. The counter electrode 21 corresponds to the light transmissive electrode of the present disclosure, wherein the first counter electrode 211 and the second counter electrode 212 are layered in this order from the side of the substrate 11. The first counter electrode 211 corresponds to the base metal layer of the present disclosure. The second counter electrode 212 corresponds to the silver thin film of the present disclosure. Note that the substrate 11, the interlayer insulating layer 12, the electron transport layer 18, the electron injection layer 19, the light transmissive electrically conductive layer 20, the counter electrode 21, and the sealing layer 22 are not formed for each pixel, but are formed common to multiple organic EL elements 1 disposed in the organic EL display panel 100.

<Substrate>

The substrate 11 includes a base material 111 which is an insulating material, and a thin film transistor (TFT) layer 112. In the TFT layer 112, a drive circuit is formed for each subpixel. According to at least one embodiment, the base material 111 is a glass substrate, a quartz substrate, a silicon substrate, a metal substrate such as molybdenum sulfide, copper, zinc, aluminum, stainless steel, magnesium, iron, nickel, gold, or silver, a semiconductor substrate such as gallium arsenide, a plastic substrate, or the like. According to at least one embodiment, a thermoplastic resin or a thermosetting resin is used to form the plastic substrate. For example, polyethylene, polypropylene, polyamide, polyimide (PI), polycarbonate, acrylic resin, polyethylene terephthalate (PET), polybutylene terephthalate, polyacetal, or other fluorine resins; or various kinds of thermoplastic elastomers such as styrene type, polyolefin type, polyvinyl chloride type, polyurethane type, fluorine rubber type or chlorinated polyethylene type; or epoxy resin, unsaturated polyester, silicone resin, polyurethane and the like; or a copolymer, copolymer blend, polymer alloy or the like including one of the polymers above are usable. According to at least one embodiment, the plastic substrate includes a single layer or multiple layers of the above material types.

<Interlayer Insulating Layer>

The interlayer insulating layer 12 is formed on the substrate 11. The interlayer insulating layer 12 including a resin material is applied to planarize the rough top surface of the TFT layer 112. An example of the resin material is a positive type photosensitive material such as an acrylic resin, a polyimide resin, a siloxane resin, or a phenol resin. Although not shown in the cross-sectional view of FIG. 1, a contact hole is formed for each subpixel in the interlayer insulating layer 12.

<Pixel Electrode>

The pixel electrode 13 includes a metal layer including a light reflective metal material, and is formed on the interlayer insulating layer 12. The pixel electrode 13 is formed for each subpixel, and is electrically connected to the TFT layer 112 through a contact hole provided in the interlayer insulating layer 12.

In at least one embodiment, the pixel electrode 13 functions as an anode.

Specific examples of metal materials with light reflectivity are silver (Ag), aluminum (Al), aluminum alloy, molybdenum (Mo), alloy of silver, palladium, and copper (APC), alloy of silver, rubidium, and gold (ARA), alloy of molybdenum, and chromium (MoCr), alloy of molybdenum and tungsten (MoW), alloy of nickel and chromium (NiCr), and the like.

According to at least one embodiment, the pixel electrode 13 is a single layer of metal, or has a laminated structure in which a layer of metal oxide such as indium tin oxide (ITO) or indium zinc oxide (IZO) is overlaid on a metal layer.

<Hole Injection Layer>

The hole injection layer 14 is disposed on the pixel electrode 13 to facilitate hole injection from the pixel electrode 13 to the light emitting layer 17. The hole injection layer 14 is a layer including an oxide of silver (Ag), molybdenum (Mo), chromium (Cr), vanadium (V), tungsten (W), nickel (Ni), or iridium (Ir), or a conductive polymer material such as poly(3,4-ethylenedioxythiophene) polystyrene sulfonate (PEDOT:PSS). Among the above materials, the hole injection layer 14 including metal oxide has a large work function, whereby it stably injects holes and assists generation of holes, injecting them to the light emitting layer 17. In at least one embodiment, the hole injection layer 14 includes tungsten oxide. When the hole injection layer 14 includes a transition metal oxide, it will have multiple oxidation numbers and energy levels. As a result, hole injection is facilitated, contributing to a reduction in voltage applied to each organic EL element.

<Bank Layer>

The bank layer 15 is formed on the hole injection layer 14 leaving it partially exposed. An area where the top surface of the hole injection layer 14 is not covered by the bank layer 15 (hereinafter referred to as an "opening") corresponds to a subpixel. In other words, the bank layer 15 has an opening 15a for each subpixel.

In at least one embodiment, the bank layer 15 is disposed on the interlayer insulating layer 12 where the pixel electrode 13 and the hole injection layer 14 are not formed. That is, in parts where the pixel electrode 13 and the hole injection layer 14 are not formed, the bottom surface of the bank layer 15 is in contact with the upper surface of the interlayer insulating layer 12.

The bank layer 15 includes, for example, an insulating organic material (e.g. acrylic resin, polyimide resin, novolac resin, phenol resin, etc.). The bank layer 15 functions as a structure to prevent overflow of applied ink when the light emitting layer 17 is formed by an application method, while functioning as a structure for placing a vapor deposition mask when the layer 17 is formed by vapor deposition method. In at least one embodiment, the bank layer 15 includes a resin material such as a positive type photosensitive material. Specific examples of such photosensitive material include acrylic resins, polyimide resins, siloxane resins, and phenol resins.

<Hole Transport Layer>

The hole transport layer 16 functions to transport holes injected from the hole injection layer 14 to the light emitting layer 17, and includes an organic material with high hole mobility for efficient transportation of holes. The hole transport layer 16 is formed by applying and drying an organic material solution. According to at least one embodiment, an organic material used for formation of the hole transport layer includes a polymer compound such as a polyfluorene or a derivative thereof, or a polyallylamine or a derivative thereof.

Alternatively, the hole transporting layer 16 includes a triazole derivative, an oxadiazole derivative, an imidazole derivative, a polyarylalkane derivative, a pyrazoline derivative and a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a porphyrin compound, an aromatic tertiary amine compound and a stearylamine compound, a butadiene compound, a polystyrene derivative, a hydrazone derivative, a triphenylmethane derivative, or a tetraphenylbenzene derivative. More specifically, according to at least one embodiment, a porphyrin compound, an aromatic tertiary amine compound and a stearylamine compound or the like is used. In this case, the hole transport layer 16 is formed by a vacuum deposition method.

<Light Emitting Layer>

The light emitting layer 17 is formed in the opening 15a. The light emitting layer 17 functions to emit light of each color R, G, and B, by recombination of holes and electrons. According to at least one embodiment, a publicly known material is used as a material of light emitting layer 17.

Examples of organic light emitting materials usable for the light emitting layer 17 include fluorescent substances such as: an oxinoid compound, a perylene compound, a coumarin compound, an azacoumarin compound, an oxazole compound, an oxadiazole compound, a perinone compound, a pyrrolopyrrole compound, a naphthalene compound, an anthracene compound, a fluorene compound, a fluoranthene compound, a tetracene compound, a pyrene compound, a coronene compound, a quinolone compound and an azaquinolone compound, a pyrazoline derivative and a pyrazolone derivative, a rhodamine compound, a chrysene compound, a phenanthrene compound, a cyclopentadiene compound, a stilbene compound, a diphenylquinone compound, a styryl compound, a butadiene compound, a dicyanomethylene pyran compound, a dicyanomethylene thiopyran compound, a fluorescein compound, a pyrylium compound, a thiapyrylium compound, a selenapyrylium compound, a telluropyrylium compound, an aromatic aldadiene compound, an oligophenylene compound, a thioxanthene compound, a cyanine compound, an acridine compound, a metal complex of an 8-hydroxyquinoline compound, a metal complex of a 2-bipyridine compound, a complex of a Schiff base and a group III metal, an oxine metal complex, a rare earth complex or the like. In addition, according to at least one embodiment, a publicly known phosphorescent substance such as a metal complex emitting phosphorescence like tris(2-phenylpyridine) iridium is used. According to at least one embodiment, the light emitting layer 17 is formed using a polymer compound such as a polyfluorene or a derivative thereof, a polyphenylene or a derivative thereof, a polyallylamine or a derivative thereof; or a mixture of the a small molecule compound and a polymer compound.

<Electron Transport Layer>

The electron transport layer 18 is formed on the light emitting layer 17 and the bank layer 15 common to multiple pixels, and functions to transport electrons injected from the counter electrode 21 to the light emitting layer 17. The electron transport layer 18 is formed using, for example, an oxadiazole derivative (OXD), a triazole derivative (TAZ), a phenanthroline derivative (BCP, Bphen), or the like.

<Electron Injection Layer>

The electron injection layer 19 is formed on the electron transport layer 18 common to multiple pixels, and functions to facilitate injection of electrons from the counter electrode 21 to the light emitting layer 17.

The electron injection layer 19 is formed, for example, by doping metal material capable of enhancing electron injection into an organic material with an electron transporting property. Here, the term "doping" refers to an approximately equal dispersing of metal atoms or metal ions of a metal material into the organic material, specifically to form a single phase including an organic material and a trace amount of metal material. According to at least one embodiment, other phases do not exist, in particular: phases composed only of metal materials such as metal pieces and metal films, or phases containing metal material as its main component do not exist. Further, in a single phase containing organic material and a trace amount of metal material, according to at least one embodiment, density of metal atoms or metal ions is uniform, and the metal atoms or the metal ions are dispersed. According to at least one embodiment, the metal material is selected from alkali metals or alkaline earth metals, such as Ba or Li. Ba is used in at least one embodiment. According to at least one embodiment, doping amount of the metal material in the electron injection layer 19 is from 5 wt % to 40 wt %. The doping amount is 20 wt % in at least one embodiment. According to at least one embodiment, the organic material having electron transporting property is a π electron low molecular weight organic material such as an oxadiazole derivative (OXD), a triazole derivative (TAZ), or a phenanthroline derivative (BCP, Bphen).

Note that according to at least one embodiment, the electron injection layer 19 has a fluoride layer of a metal selected from alkali metals or alkaline earth metals on the side of the light emitting layer 17.

<Light Transmissive Electrically Conductive Layer>

A light transmissive electrically conductive layer 20 is formed on the electron injection layer 19 common to multiple pixels, and is an electrically conductive film which transmits visible light.

The light transmissive electrically conductive layer 20 is provided to form an optical resonator structure in which an upper surface of the pixel electrode 13 and a bottom surface of the second counter electrode 212 are its reflective surfaces. Therefore, according to at least one embodiment, the light transmissive electrically conductive layer 20 has a high transmission of visible light, while having a refraction index different from the second counter electrode 212 which is a silver thin film. According to at least one embodiment, a metal oxide with both light transmissive and conductive property is used as a material to form a light transmissive electrically conductive layer 20, which is, for example, a material such as ITO or IZO.

Figure 2:
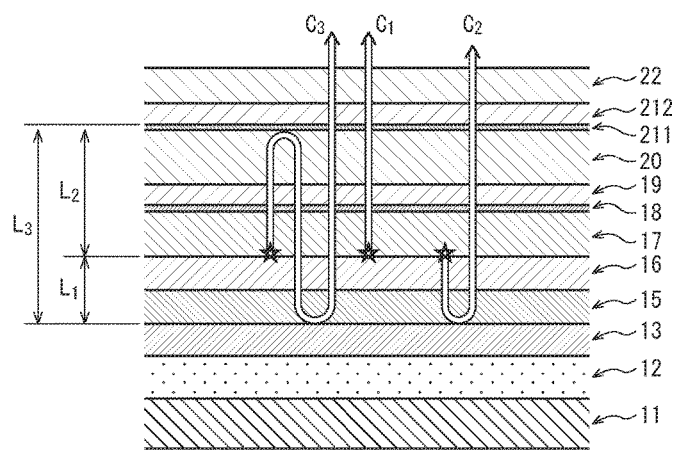
FIG. 2 is a cross-sectional view schematically showing an optical resonator structure of an organic EL display panel 100 pertaining to at least one embodiment.

The film thickness of the light transmissive electrically conductive layer 20 is adjusted to form the optical resonator structure having the following surfaces as its reflective surfaces: an interfacial surface of the counter electrode 21 and the light transmissive electrically conductive layer 20, and an interfacial surface of the pixel electrode 13 and the hole injection layer 14. FIG. 2 describes the interference of light in the optical resonator structure. Main paths of light emitted from the light emitting layer 17 are shown in this figure. Path C1 shows a path where light emitted from the light emitting layer 17 in the direction of the counter electrode 21 is transmitted through the counter electrode 21 without being reflected. Path C2 shows a path where light emitted from the light emitting layer 17 in the direction of the pixel electrode 13 is reflected and transmitted through the light emitting layer 17 and the counter electrode 21. Path C3 shows a path where light emitted from the light emitting layer 17 in the direction of the counter electrode 21 is reflected by the counter electrode 21, and then reflected by pixel electrode 13, to be finally transmitted through the light emitting layer 17 and the counter electrode 21. Interference occurs between light emitted via paths C1, C2, and C3. Optical distance between path C2 and path C3 corresponds to optical film thickness L2 shown in FIG. 2. Likewise, optical distance between path C1 and path C3 corresponds to optical film thickness L3 shown in FIG. 2. The film thickness of the light transmissive electrically conductive layer 20 is designed to set the optical film thickness L2 and the optical film thickness L3 to the appropriate values.

Specifically, optical film thickness L2 and L3 are calculated as follows. When the film thickness of the hole injection layer 14 is $t_1$ and its refractive index is $n_1$, the film thickness of the hole transport layer 16 is $t_2$ and its refractive index is $n_2$, the film thickness of the light emitting layer 17 is $t_3$ and its refractive index is $n_3$, the film thickness of the electron transport layer 18 is $t_4$ and its refractive index is $n_4$, the film thickness of the electron injection layer 19 is $t_5$ and its refractive index is $n_5$, and the film thickness of the light transmissive electrically conductive layer 20 is $t_6$ and its refractive index is $n_6$, the optical film thickness L2 and L3 are calculated by $n_4 t_4 + n_5 t_5 + n_6 t_6$ and $n_1 t_1 + n_2 t_2 + n_3 t_3 + n_4 t_4 + n_5 t_5 + n_6 t_6$, respectively. Hence, the film thickness $t_6$ of the light transmissive electrically conductive layer 20 is designed so the optical film thickness L2 and L3 are set to the appropriate values.

<Counter Electrode>

The counter electrode 21 is formed on the light transmissive electrically conductive layer 20 common to multiple pixels, and functions as a cathode.

The counter electrode 21 has a layered structure in which the second counter electrode 212 mainly including silver is layered on the upper surface of the first counter electrode 211 which suppresses islanding of nano-sized crystals when forming the second counter electrode 212. It should be noted that the counter electrode 21 is not limited to the structure mentioned above, and according to at least one embodiment further includes a layer including, for example, ITO or IZO, under the first counter electrode 211 or above the second counter electrode 212.

One or more materials for the first counter electrode 211 are selected from alkali metals and alkaline earth metals, and as a specific example, barium is selected for at least one embodiment. The first counter electrode 211 is formed as a single metal or an alloy including two or more selected metal elements and does not include an ionic compound such as a metal oxide or a metal salt. Oxidation of silver, particularly generation of silver oxide between the surface of the first counter electrode 211 and the second counter electrode 212 caused by oxide ion and carbonate ion and the like is suppressed or minimized, as no anions are contained in the first counter electrode 211. In at least one embodiment, the film thickness of the first counter electrode 211 ranges from 0.5 nm to 5 nm. In at least one embodiment, the film thickness of the first counter electrode 211 ranges from 1 nm to 2 nm. According to at least one embodiment, transmittance of visible light through the first counter electrode is increased while retaining the effect to suppress islanding of silver by setting film thickness of the first counter electrode 211 to the above range.

The second counter electrode 212 includes silver or silver alloy mainly composed of silver. Here, a silver alloy mainly composed of silver refers to an alloy having the same structure, electrical characteristics, and optical characteristics as those of pure silver, specifically, an alloy having a structure of which one or more elements are mixed into silver to form a solid solution. In other words, it is not intended to be an alloy whose structures, electrical characteristics, or optical characteristics significantly differ from those of pure silver, such as an intermetallic compound of silver and dissimilar element, or an alloy with silver as additive element. Since an organic EL element 1 is a so-called top emission type, the second counter electrode 212 transmits light. In at least one embodiment, the film thickness of the second counter electrode 212 is 20 nm or less. In at least one embodiment, the film thickness of the second counter electrode 212 ranges from 7 nm to 17 nm. According to at least one embodiment, transmittance of visible light through the second counter electrode 212 is increased while enhancing the conductivity of the second counter electrode 212 by setting the film thickness of the second counter electrode 212 to the above range.

<Sealing Layer>

The sealing layer 22 is disposed on the counter electrode 21. The sealing layer 22 suppresses invasion of impurities (water, oxygen) from the opposite side of the substrate 11 into the counter electrode 21, the light transmissive electrically conductive layer 20, the electron injection layer 19, the electron transport layer 18, and the light emitting layer 17, etc., and functions to suppress deterioration of these layers caused by impurities. The sealing layer 22 is formed using a light transmissive material such as silicon nitride (SiN) or silicon oxynitride (SiON). In addition, according to at least one embodiment, a sealing resin layer including a resin material such as acrylic resin, silicone resin, or the like is disposed on a layer formed by materials such as silicon nitride (SiN) or silicon oxynitride (SiON).

According to at least one embodiment, the sealing layer 22 includes a light transmissive material, as an organic EL display panel 100 is a top emission type.

<Other>

Although not indicated in FIG. 1, according to at least one embodiment, a color filter or an upper substrate is laminated on the sealing layer 22 mediated by a sealing resin. By laminating an upper substrate, according to at least one embodiment, the hole transport layer 16, the light emitting layer 17, the electron transport layer 18, the electron injection layer 19, and the counter electrode 21 are protected from moisture, air, and the like.

2. Manufacturing Method of Organic EL Element 1

A manufacturing method of organic EL element 1 pertaining to at least one embodiment is described with reference to the drawings. FIG. 3A to FIG. 6B are schematic cross-sectional views showing states at steps in the manufacturing of the organic EL element 1.

(1) Creating Substrate 11

Figure 3A:
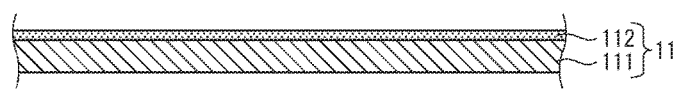
FIG. 3A, FIG. 3B, FIG. 3C, FIG. 3D, FIG. 3E are partial cross-sectional views schematically showing a part of an organic EL display panel 100 manufacturing process pertaining to at least one embodiment.
Figure 7:
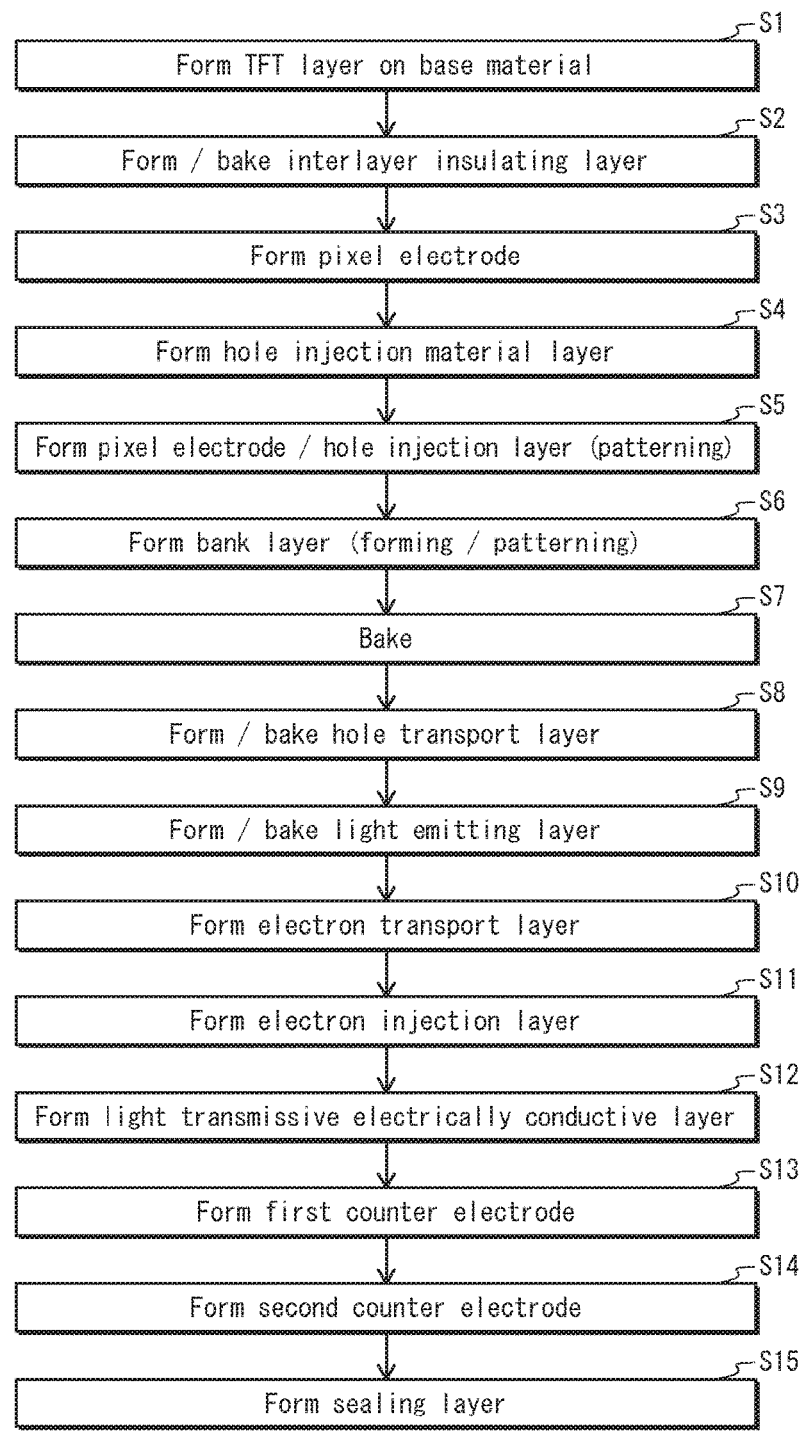
FIG. 7 is a flowchart showing the organic EL display panel 100 manufacturing process pertaining to at least one embodiment.

First, in FIG. 3A, the TFT layer 112 is formed on the substrate 111 to form the substrate 11 (FIG. 7, Step S1). According to at least one embodiment, the TFT layer 112 is formed by a publicly known TFT manufacturing method.

Figure 3B:
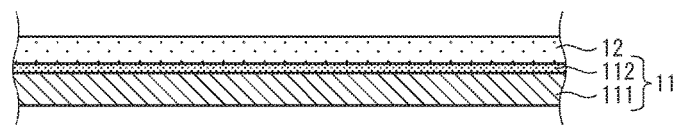

Then, in FIG. 3B, the interlayer insulating layer 12 is formed on the substrate 11 (FIG. 7, Step S2). According to at least one embodiment, the interlayer insulating layer 12 is formed in multilayers by using, for example, a plasma chemical vapor deposition (CVD) method, a sputtering method, or the like.

Then, on the interlayer insulating layer 12, dry etching is performed to an area corresponding to a source electrode on the TFT layer, thus generating a contact hole. The contact hole is formed exposing a portion of the source electrode at a bottom portion thereof.

Then, a connection electrode layer is formed along the inner wall of the contact hole. A part of the upper portion of the connection electrode layer is formed on the surface of the interlayer insulating layer 12. According to at least one embodiment, the connection electrode layer is formed using, for example, a sputtering method to deposit a metal film, followed by a photolithography method and a wet etching method to perform patterning.

(2) Creating Pixel Electrode 13 and Hole Injection Layer 14

Figure 3C:
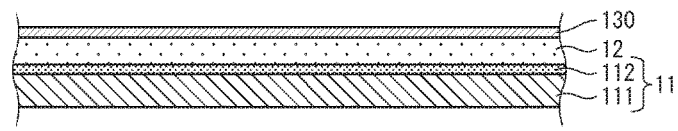

Next, as FIG. 3C indicates, the pixel electrode material layer 130 is formed on the interlayer insulating layer 12 (FIG. 7, Step S3). According to at least one embodiment, the pixel electrode material layer 130 is formed using, for example, a vacuum deposition method, a sputtering method, or the like.

Figure 3D:
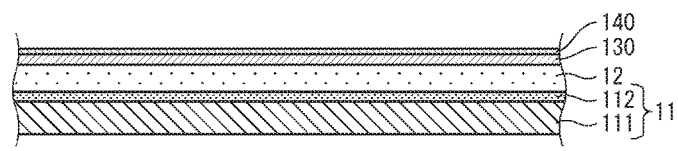

Then, in FIG. 3D, a hole injection material layer 140 is formed on the pixel electrode material layer 130 (FIG. 7, Step S4). The hole injection material layer 140 is formed using, for example, a reactive sputtering method or the like.

Figure 3E:
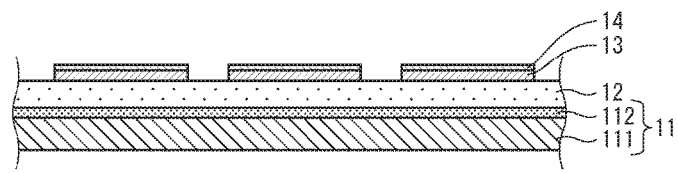

Then, in FIG. 3E, the pixel electrode material layer 130 and the hole injection material layer 140 are patterned by etching, thus forming multiple pixel electrodes 13 and hole injection layers 14 partitioned for each subpixel (FIG. 7, Step S5).

Note that the method of forming the pixel electrode 13 and the hole injection layer 14 is not limited to the method described in at least one embodiment. According to at least one embodiment, for example, the hole injection layer 14 is formed after patterning the pixel electrode material layer 130 and forming the pixel electrode 13.

Figure 4A:
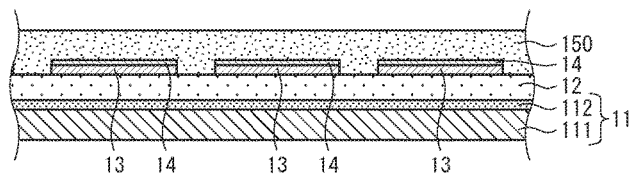
FIG. 4A, FIG. 4B, FIG. 4C, FIG. 4D are cross-sectional views schematically showing a part of the organic EL display panel 100 manufacturing process pertaining to at least one embodiment.
Figure 4B:
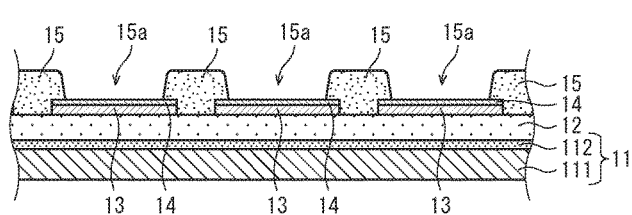

Subsequently, in FIG. 4A, the bank layer resin which is the material of the bank layer 15 is applied on the hole injection layer 14 and the interlayer insulating layer 12 to form the bank material layer 150. According to at least one embodiment, for example, the bank layer resin is a phenol resin which is a positive type photosensitive material. The bank material layer 150 is formed by homogenously applying a solution: a phenol resin which is a bank layer resin, dissolved in a solvent (for example, a mixed solvent of ethyl lactate and gamma-Butyrolactone (GBL)) using a spin coat method or the like, on the hole injection layer 14 and the interlayer insulating layer 12. Pattern exposure and development are performed on the bank material layer 150 to form the bank layer 15 (FIG. 5B, FIG. 7 Step S6), followed by baking (FIG. 7, Step S7). Thereby the opening 15a is defined, wherein the light emitting layer 17 is formed. According to at least one embodiment, the bank layer 15 is baked, for example, at a temperature from 150 to 210 degrees Celsius for 60 minutes.

Additionally, according to at least one embodiment, in forming the bank layer 15, the surface of the bank layer 15 is further treated with a predetermined alkaline solution, water, an organic solvent, or the like, or is subjected to a plasma treatment. The surface of the bank layer 15 is treated to adjust the contact angle with ink (solution) applied to the opening 15a, or to impart liquid repellency.

Figure 4C:
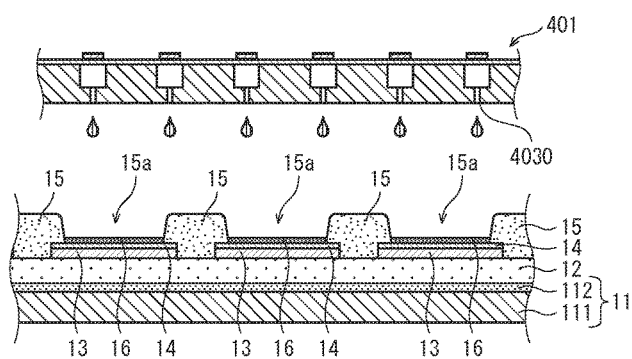

Next, in FIG. 4C, ink containing the constituent material of the hole transport layer 16 is discharged from a nozzle 4030 of an ink jet head 401 to the hole injection layer 14 in the opening portion 15a which is defined by the bank layer 15, and then baked (dried) to form the hole transport layer 16 (FIG. 7, Step S8).

Figure 4D:
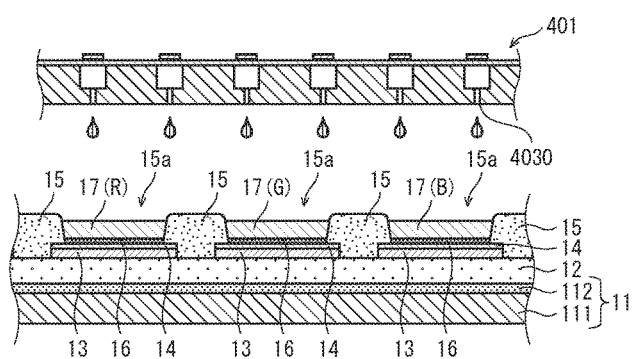

Then, in FIG. 4D, ink containing the constituent material of the light emitting layer 17 is discharged from the nozzle 4030 of the ink jet head 401 to the hole transport layer 16 in the opening 15a, and then baked (dried) to form the light emitting layer 17 (FIG. 7, Step S9).

Figure 5A:
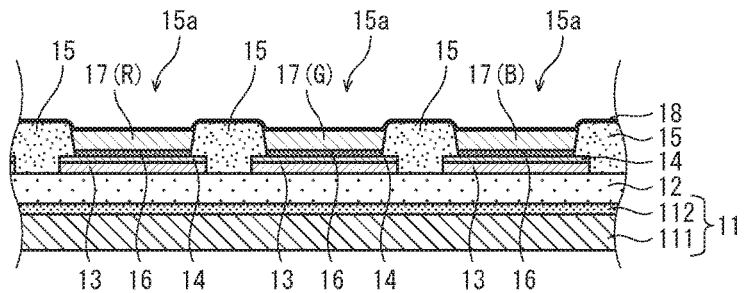

Subsequently, in FIG. 5A, a material including the electron transport layer 18 is deposited across each subpixel on the light emitting layer 17 and the bank layer 15 by a vacuum deposition method or a sputtering method, to form the electron transport layer 18 (FIG. 7, Step S10).

Figure 5B:
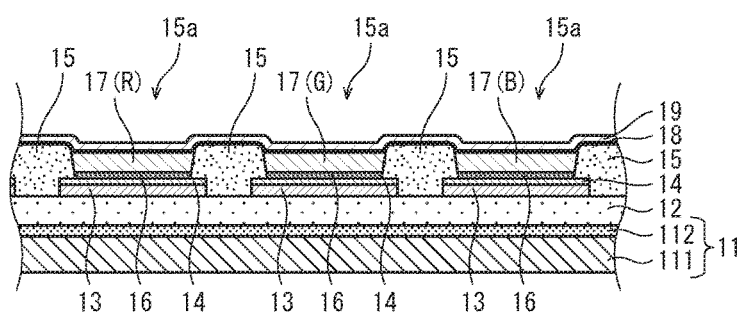
FIG. 5B is a partial cross-sectional view showing a state in which an electron injection layer is formed on the electron transport layer.

Next, in FIG. 5B, a material including the electron injection layer 19 is deposited across each subpixel on the electron transport layer 18 by a method such as vapor deposition, spin coating, casting, or the like, to form the electron injection layer 19 (FIG. 7, Step S11).

Figure 5C:
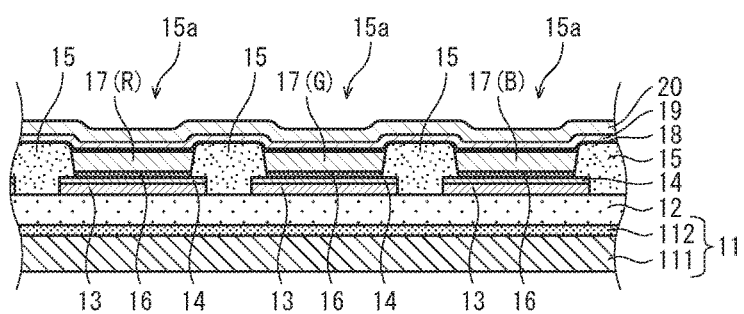
FIG. 5C, FIG. 5D are partial cross-sectional views schematically showing a part of the organic EL display panel 100 manufacturing process pertaining to at least one embodiment.

Subsequently, in FIG. 5C, a material constituting the light transmissive electrically conductive layer 20 is deposited in common for each subpixel by a sputtering method, a vacuum deposition method, or the like, to form the light transmissive electrically conductive layer 20 (FIG. 7, Step S12).

Figure 5D:
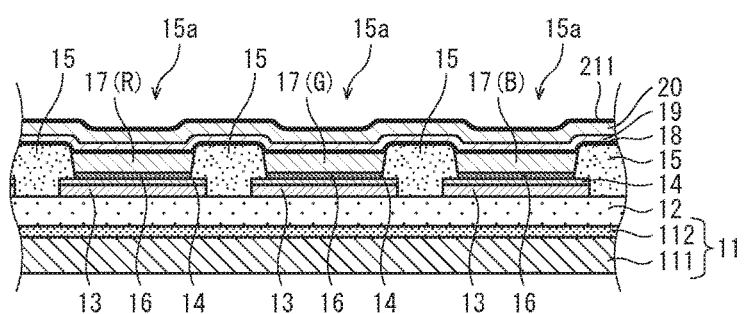

Then, in FIG. 5D, a first counter electrode 211 is formed on the light transmissive electrically conductive layer 20.

First, metal barium is used as a target to form a film by a sputtering method, forming the first counter electrode 211 (FIG. 7, Step S13).

Next, in FIG. 6A, a second counter electrode 212 is formed on the first counter electrode 211. After forming the first counter electrode 211, a film is formed by a sputtering method using silver as a target, to form a second counter electrode 212 (FIG. 7, Step S14).

The method of manufacturing the first counter electrode 211 and the second counter electrode 212 is not limited to the method described above. According to at least one embodiment, either or both of the counter electrodes are formed by a vacuum deposition method.

Subsequently, in FIG. 6B, the sealing layer 22 is formed on the second counter electrode 212 (FIG. 7, Step S15). Specifically, the sealing layer 22 is formed by depositing silicon nitride, silicon oxynitride, or the like by a sputtering method, a CVD method, or the like.

Hence, the organic EL display panel 100 is completed as indicated by the steps in the above-mentioned embodiment. The organic EL display panel 100 pertaining to at least one embodiment is characterized by the formation of the counter electrode 21, wherein the second counter electrode 212 mainly including silver is applied on the first counter electrode 211 serving as a base metal layer, including a simple alkali metal or an alkaline earth metal, or an alloy of two or more of alkali metals or alkaline earth metals.

Note that according to at least one embodiment, a color filter or an upper substrate is placed on and joined to the sealing layer 22.

3. Characteristics of Upper Electrode

The inventors have conducted evaluation tests on sheet resistance, light transmittance and light reflectance of the counter electrode. The samples subjected to the evaluation test are Sample A, corresponding to the working example, and Sample B, corresponding to the comparative example. In Sample A, a base metal layer including Ba is formed with a film thickness of 1 nm on an IZO substrate, and a silver thin film is formed with a film thickness of 15 nm on the base metal layer. In contrast, in Sample B, a silver thin film is formed directly on an IZO substrate with a film thickness of 15 nm.

(1) Sheet Resistance

Figure 8A:
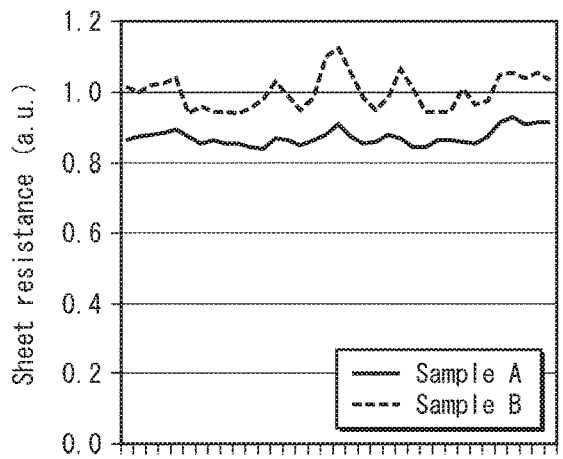
FIG. 8A is a diagram showing sheet resistance values of a counter electrode pertaining to a working example and a comparative example, respectively.

FIG. 8A is a chart of local sheet resistance values measured in each sample. Here, the local sheet resistance values are sheet resistance values in each region of the samples divided in the direction parallel to the substrate. Further, the sheet resistance values are expressed as relative values assuming that an arithmetic mean of the sheet resistance values in the Sample B is 1. In FIG. 8A, the sheet resistance values of Sample A are low with respect to Sample B. Additionally, in Sample A, the variation of the sheet resistance values in each location are small with respect to Sample B. In other words, with respect to the Sample B, Sample A has low sheet resistance values and small variation in the sheet resistance values.

(2) Light Transmittance

Figure 8B:
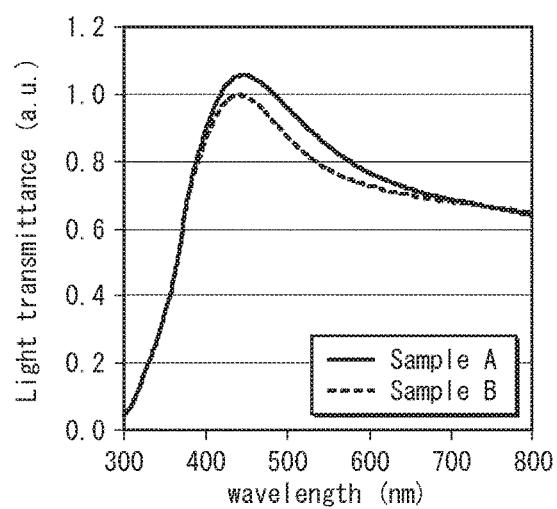
FIG. 8B is a diagram showing light transmittance of a counter electrode pertaining to the working example and the comparative example, respectively.

FIG. 8B is a chart of light transmittance at each wavelength of light measured in each sample. Note that the light transmittance is expressed as a relative value assuming that the highest value of the light transmittance in Sample B is 1. As FIG. 8B indicates, the light transmittance of Sample A is higher than that of Sample B for light wavelengths from 400 nm to 700 nm. In other words, the light transmittance of Sample A is higher than that of Sample B for most wavelengths of light emitted by the light emitting element.

(3) Light Reflectance

Figure 8C:
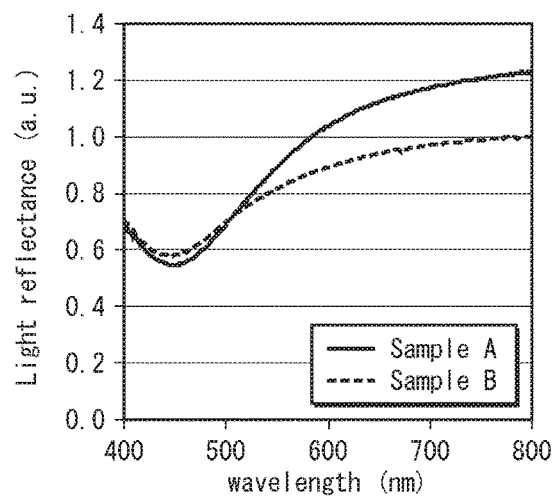
FIG. 8C is a diagram showing light reflectance of the counter electrode pertaining to the working example and the comparative example, respectively.

FIG. 8C is a chart of light reflectance at each wavelength of light measured in each sample. Note that the light reflectance is expressed as a relative value assuming the highest light reflectivity in Sample B is 1. In FIG. 8C, as for light wavelengths from 400 nm to 500 nm, the light reflectance is slightly higher in Sample B, whereas for light wavelengths from 500 nm to 700 nm, the light reflectance is higher in Sample A than in Sample B. In other words, the light reflectance of Sample A is higher than that of Sample B for most wavelengths of light emitted by the light emitting element.

(4) Summary

As described above, the film quality of the silver thin film becomes more homogenous when formed on the base metal layer including a simple alkali metal or an alkaline earth metal, or an alloy of an alkali metal or an alkaline earth metal. The sheet resistance characteristics indicate the counter electrode pertaining to at least one embodiment has smaller variation in the sheet resistance values and lower mean value as compared with those of the silver thin film with the same thickness. The counter electrode pertaining to at least one embodiment suppresses islanding, and therefore has smaller silver crystal size and reduced variation in film thickness. As described above, variation in sheet resistance values occurs from islanding which causes the generation of the enlarged crystal size with respect to film thickness leading to film thickness variation. Further, the characteristics of the light reflectance and the light transmittance indicate improved homogeneity of film thickness in the counter electrode according to at least one embodiment.

Such characteristics of the counter electrode pertaining to at least one embodiment have been enhanced by suppressing the island generation through adhesion of silver atoms to the base metal layer. When the silver atoms adhere to the base metal layer, agglomeration of silver atoms decreases as a whole and the formation of coarse crystals is suppressed accordingly. Thus, the same suppression effect as the counter electrode pertaining to at least one embodiment is obtained by using a base layer material having high affinity with silver atoms. Further, in at least one embodiment, the metal layer is used as the base layer to suppress the oxidation of silver caused by anions. Because when an ionic substance, particularly an oxidizing substance, is used as the base layer, silver oxide is formed on the interface of the base layer and the silver thin film, despite the suppression of islanding. In at least one embodiment, the increase in sheet resistance and the decrease in light transmittance due to generation of silver oxide is suppressed or minimized by using the metal layer as the base layer.

4. Overall Structure of the Organic EL Display Device

Figure 9:
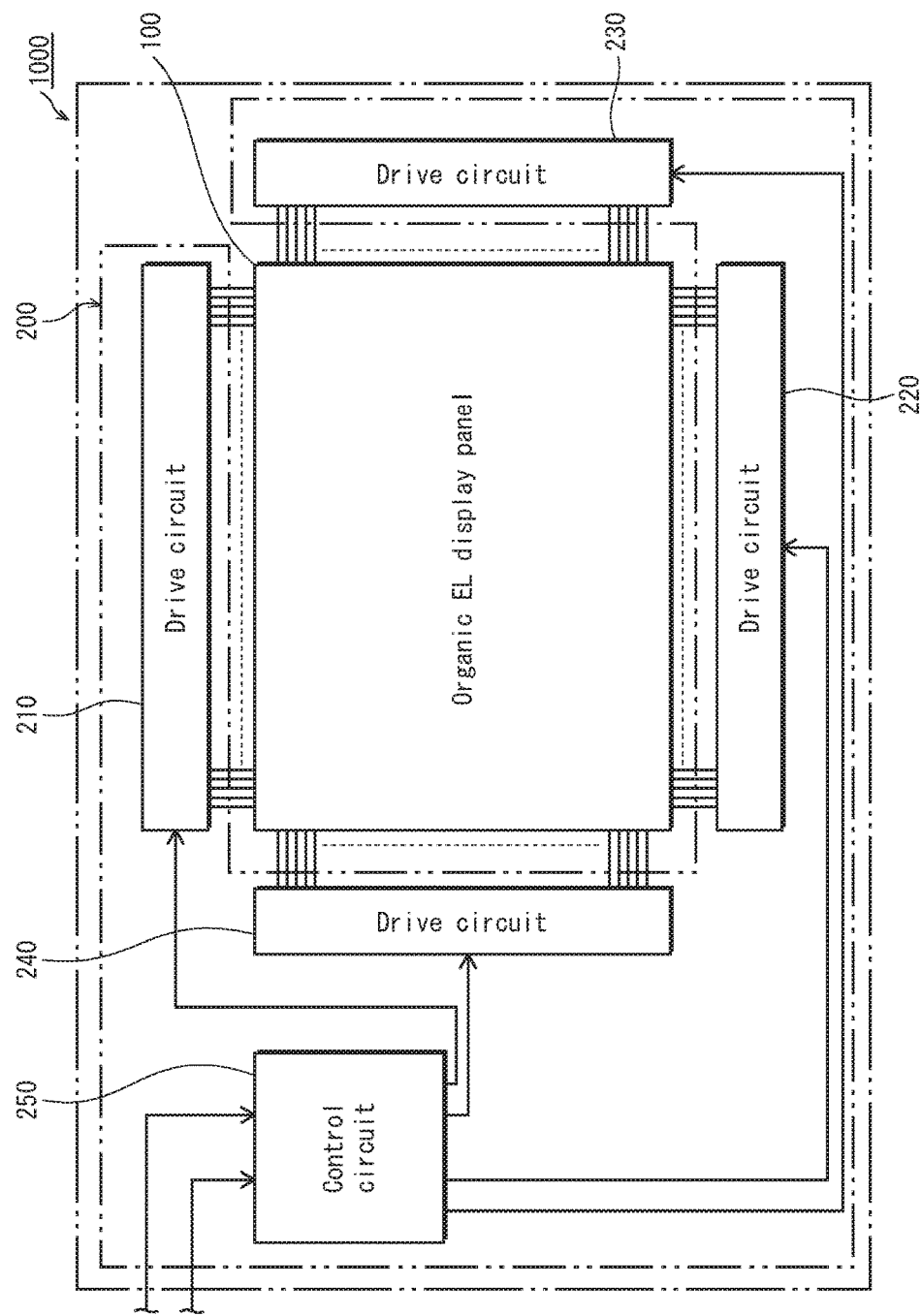
FIG. 9 is a schematic block diagram showing a schematic configuration of an organic EL display device pertaining to at least one embodiment.

FIG. 9 is a schematic block diagram of the structure of an organic EL display device 1000 including the organic EL display panel 100. In FIG. 9, the organic EL display device 1000 includes an organic EL display panel 100 and a drive control unit 200 connected to the organic EL display panel 100. The drive control unit 200 includes four drive circuits from 210 to 240 and a control circuit 250.

Note that in the organic EL display device 1000, the arrangement of the drive control unit 200 with respect to the organic EL display panel 100 is not limited to the arrangement in FIG. 9.

5. Other Embodiments (1) At least one embodiment of the present disclosure describes the light transmissive electrically conductive layer 20 formed to set the thickness of the optical thin films L2 and L3 in the optical resonator structure to the appropriate range. However, according to at least one embodiment, the organic EL display panel does not have the light transmissive electrically conductive layer 20.

In at least one embodiment, the hole injection layer 14, the hole transport layer 16, the electron transport layer 18, or the electron injection layer 19 may or may not be configured as described above. For example, a single hole injection transport layer may be provided instead of the hole injection layer 14 and the hole transport layer 16. Alternatively, for example, the electron injection layer 19 does not have to be provided.

(2) In at least one embodiment, the organic EL display panel is described as the top emission type, in which the pixel electrode is light reflective and the counter electrode is light transmissive. Alternatively, the organic EL display panel pertaining to the present disclosure may be of a so-called bottom emission type. The counter electrode of the bottom emission type of organic EL display panel may be light reflective, realized by using a publicly known reflection type electrode. In such case, a pixel electrode will be light transmissive, having the structure of the counter electrode 21 according to at least one embodiment. Specifically, a light transmissive pixel electrode including a base metal layer and a silver thin film can be formed by disposing a base metal layer similar to the first counter electrode 211 on an interlayer insulating layer 12, and forming a silver thin film similar to the second counter electrode 212 on the base metal layer.

Alternatively, for example, a counter electrode and a pixel electrode of the organic EL display panel pertaining to at least one embodiment of the present disclosure can both be configured similar to the counter electrode 21 pertaining to at least one embodiment.

(3) In at least one embodiment, the light emitting panel pertaining to at least one embodiment of the present disclosure is described as being an organic EL display panel, but is not limited thereto. The light emitting panel pertaining to at least one embodiment of the present disclosure can be a light emitting panel using an inorganic light emitting material.

Further, the present disclosure is not limited to a display device, but includes a panel type illumination device such as an organic EL illumination device.

(4) As mentioned above, the organic EL display panel and the organic EL display device pertaining to the present disclosure have been described based on at least one embodiment. However, the present disclosure is not limited to the above-described embodiments. The present disclosure includes at least one embodiment realized by combining any of the above-described embodiments with various modifications that can be conceived by those skilled in the art, or by arbitrarily combining the components and functions in the above-described embodiments without departing from the spirit of the present disclosure.

The technology pertaining to the present disclosure is useful in manufacturing a light-emitting panel with reduced variation in in-plane light emission intensity, provided that the light-emitting panel has a light transmissive electrode layer disposed on one side of a light-emitting layer and is thus structured to extract light emitted from the light-emitting layer to the outside of the panel.

Although the technology pertaining to the present disclosure has been fully described by way of examples with reference to the accompanying drawings, it is to be noted that various changes and modifications will be apparent to those skilled in the art. Therefore, unless such changes and modifications depart from the scope of the present disclosure, they should be construed as being included therein.

What is claimed is:

1. An organic electro-luminescence (EL) element, comprising:
a first electrode, a light emitting layer, a light transmissive electrically conductive layer, and a second electrode layered in this order above a substrate, wherein
the second electrode is a light transmissive electrode,
the light transmissive electrode includes a base metal layer which is a metal layer including an alkali metal or an alkaline earth metal as a material and a silver thin film, which is silver or a silver alloy including silver as a main component, disposed on and in contact with the base metal layer,
the light transmissive electrically conductive layer is in contact with the second electrode, and
a light emitting layer-side surface of the first electrode and an interface of the light transmissive electrically conductive layer and the second electrode are reflective surfaces of an optical resonator structure.

2. The organic EL element of claim 1, wherein
film thickness of the silver thin film is 20 nm or less.

3. The organic EL element of claim 1, wherein
the material of the base metal layer is selected from the group consisting of barium, calcium, magnesium and combinations thereof.

4. The organic EL element of claim 3, wherein
the material of the base metal layer is barium.

5. The organic EL element of claim 1, wherein
film thickness of the base metal layer is from 0.5 nm to 5 nm.

6. The organic EL element of claim 5, wherein
the film thickness of the base metal layer is from 1 nm to 2 nm.

7. The organic EL element of claim 1, wherein
a material of the light transmissive electrically conductive layer is selected from the group consisting of indium tin oxide (no) and indium zinc oxide (IZO).

8. An organic electro-luminescence (EL) display panel, comprising:
a substrate; and
multiple organic EL elements above the substrate, wherein
each of the organic EL elements comprises a first electrode, a light emitting layer, a light transmissive electrically conductive layer, and a second electrode layered in this order above the substrate,
the second electrode is a light transmissive electrode,
the light transmissive electrode includes a base metal layer which is a metal layer including an alkali metal or an alkaline earth metal as a material and a silver thin film, which is silver or a silver alloy including silver as a main component, disposed on and in contact with the base metal layer,
the light transmissive electrically conductive layer is in contact with the second electrode, and
a light emitting layer side surface of the first electrode and an interface of the light transmissive electrically conductive layer and the second electrode are reflective surfaces of an optical resonator structure.

9. A method of manufacturing an organic electro-luminescence (EL) element comprising a light reflective pixel electrode, a light emitting layer, a light transmissive electrically conductive layer, and a light transmissive counter electrode layered in this order above a substrate, the method comprising:
   forming the counter electrode, including
      forming a base metal layer which is a metal layer including an alkaline metal or an alkaline earth metal as a material, and
      forming a silver thin film, which is silver or a silver alloy including silver as a main component, after forming the base metal layer, wherein
   the silver thin film is disposed on and in contact with the base metal layer,
   the light transmissive electrically conductive layer is in contact with the counter electrode, and
   a light emitting layer-side surface of the light reflective pixel electrode and an interface of the light transmissive electrically conductive layer and the counter electrode are reflective surfaces of an optical resonator structure.

10. A method of manufacturing an organic electro-luminescence (EL) element comprising a light transmissive electrically conductive layer, a light transmissive pixel electrode, a light emitting layer, and a light reflective counter electrode layered in this order above a substrate, the method comprising:
   forming the pixel electrode, including
      forming a base metal layer which is a metal layer including an alkaline metal or an alkaline earth metal as a material, and
      forming a silver thin film, which is silver or a silver alloy including silver as a main component, after forming the base metal layer, wherein
   the silver thin film is disposed on and in contact with the base metal layer,
   the light transmissive electrically conductive layer is in contact with the pixel electrode, and
   a light emitting layer-side surface of the light reflective counter electrode and an interface of the light transmissive electrically conductive layer and the pixel electrode are reflective surfaces of an optical resonator structure.

11. The method of claim 9, wherein
   when forming the base metal layer, film thickness of the base metal layer is made to be from 0.5 nm to 5 nm.

12. The method of claim 9, wherein
   when forming the base metal layer, film thickness of the base metal layer is made to be from 1 nm to 2 nm.

* * * * *